Figure 1:
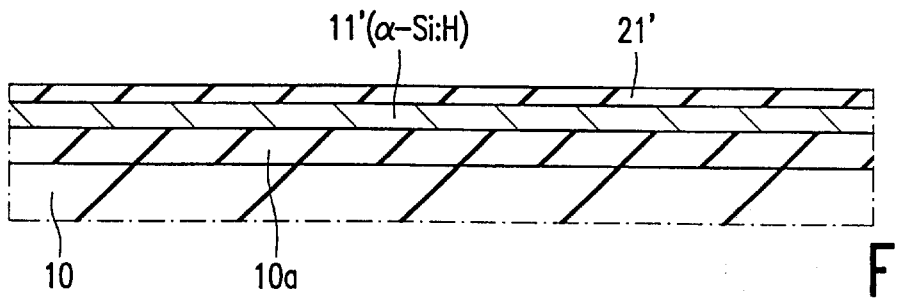

United States Patent
Young

[11] Patent Number: 5,980,763
[45] Date of Patent: Nov. 9, 1999

[54] ELECTRONIC DEVICE MANUFACTURE

[75] Inventor: Nigel D. Young, Redhill, United Kingdom

[73] Assignee: U.S. Philips Corporation, New York, N.Y.

[21] Appl. No.: 08/866,648

[22] Filed: May 30, 1997

[30] Foreign Application Priority Data

Jun. 21, 1996 [GB] United Kingdom .................... 9613065

[51] Int. Cl.⁶ .............................. H01L 21/00; B44C 1/22
[52] U.S. Cl. .................. 216/23; 216/65; 216/67; 216/79; 438/719; 438/735; 438/753
[58] Field of Search .................... 216/23, 2, 51, 216/65, 79, 67, 66, 99; 438/30, 707, 710, 719, 733, 735, 753, 745

[56] References Cited

U.S. PATENT DOCUMENTS

| 5,130,829 | 7/1992 | Shannon | 359/59 |
| 5,508,555 | 4/1996 | Brotherton et al. | 257/650 |
| 5,637,187 | 6/1997 | Takasu et al. | 216/23 X |

FOREIGN PATENT DOCUMENTS

| 4120738 | 4/1992 | Japan . |
| 6045354 | 2/1994 | Japan . |
| 7078760 | 3/1995 | Japan . |
| 8078690 | 3/1996 | Japan . |

*Primary Examiner*—William Powell
*Attorney, Agent, or Firm*—John C. Fox

[57] ABSTRACT

A flat panel display or other large-area electronic device comprises at least one TFT (T1;T2) having a crystalline channel region (1) and amorphous edge regions (13) adjacent side-walls (12) of the TFT island (11). The TFT is fabricated by steps which include:

(a) depositing on substrate (10) a thin film (11') of amorphous semiconductor material to provide the semiconductor material, (b) removing areas of the thin film (11') to form the side walls (12a, 12b) of each island (11), (c) forming a masking pattern 20 over the edge regions (13a, 13b) preferably on an insulating film 22, and (d) directing a laser or other energy beam (50) towards the islands (11) and the masking pattern (20) to crystallise the un-masked semiconductor material for the crystalline channel region (1), while retaining amorphous semiconductor material adjacent the side walls (12a, 12b) where the edge regions (13a, 13b) are masked from the energy beam (50) by the masking pattern (20). The resulting device structure has e.g polycrystalline TFTs (T1, T2) with low off-state leakage currents as a result of the amorphous material properties kept for the edge regions (13a) particularly where crossed by the insulated gate (4). The substrate (10) may be of polymer material which also is masked from the beam (50) by the masking pattern (20).

10 Claims, 2 Drawing Sheets

ELECTRONIC DEVICE MANUFACTURE

This invention relates to methods of manufacturing an electronic device comprising a thin-film transistor having a crystalline semiconductor channel region. The device may be, for example, a liquid-crystal display or other flat panel display, or any other type of large area electronic device, for example, a thin-film image sensor or data store. The invention also relates to electronic devices manufactured by such methods.

There is currently much interest in developing thin-film field effect transistors (hereinafter termed "TFTs") on glass and other insulating substrates for large area electronics applications, for example, flat panel displays. Such TFTs fabricated with amorphous or polycrystalline semiconductor films may form the switching elements of a cell matrix, for example, in a flat panel display as described in U.S. Pat. No. 5,130,829 (Our Ref: PHB 33646), the whole contents of which are hereby incorporated herein as reference material. A more recent development involves the fabrication and integration of circuits from TFTs (often using polycrystalline silicon), for example as integrated drive circuits for the matrix of a flat-panel display.

For polycrystalline silicon TFTs, the semiconductor film may be deposited as polycrystalline silicon. Alternatively it may be deposited as amorphous silicon which is subsequently converted in situ on the substrate into polycrystalline silicon by heating either in a furnace or with an energy beam usually from a laser. However, even when the resulting film is of large-grain polycrystalline silicon, it has a high density of charge trapping states due to the disorder in the film. These charge trapping states cause the material to behave quite differently from monocrystalline silicon. Thus, for example, TFTs (even with large-grain polycrystalline silicon) have a high leakage current and a high threshold voltage as compared with field effect transistors formed in monocrystalline silicon. Furthermore, low doping levels have little or no effect in changing the generally intrinsic conductivity type of the film which results from the high density of trapping levels near the middle of the bandgap of the semiconductor material. It is known that passivating treatments can be (and preferably are) carried out on the disordered thin-film semiconductor material to improve its properties. Thus, in the case of polycrystalline silicon, a hydrogenation treatment is usually effected to passivate the trapping states at the grain boundaries. Depending on the particular processing used, the generally intrinsic conductivity of the resulting polycrystalline silicon may be very slightly biased towards n type with high resistivity.

As regards the leakage current of a polycrystalline TFT, an important role seems to be played by edge regions of the thin-film semiconductor island, adjacent the side walls between the source and drain of the transistor. Of particular importance is the part of the side walls which is crossed by the insulated gate of the transistor. The English language Abstract 07176752A of the Patent Abstracts of Japan and the drawings of published Japanese Patent Application Kokai JP-A-07-176752 disclose a manufacturing method in which the edge leakage current between source and drain of a polycrystalline TFT is reduced by converting the edge regions into amorphous material. The conversion is achieved by implanting ions (typically silicon ions) in the crystalline edge regions. The resulting TFT has a crystalline semiconductor channel region in the semiconductor thin-film island adjacent an insulated gate of the transistor, the thin-film island having side walls which are crossed by the insulated gate, and edge regions of the thin-film island adjacent the side walls are of amorphous semiconductor material.

This implantation method disclosed in JP-A-07-176752 for forming these amorphous edge regions requires extra processing steps in the manufacture. The implantation dose required is high, for example, of the order of $10^{15}$ ions $cm^{-2}$ or more. The provision and removal of a suitable implantation mask is also a complication of the process.

It is an aim of the present invention to provide an alternative, more advantageous method for forming amorphous edge regions of the semiconductor thin-film island of a TFT, which avoids complicating the manufacturing process and which is compatible with the processing desired for a variety of device structures, for example flat panel displays and other large-area electronic devices in which the substrate comprises polymer material.

According to the present invention there is provided a method of manufacturing an electronic device comprising a thin-film transistor having a crystalline semiconductor channel region in a semiconductor thin-film island adjacent an insulated gate of the transistor, the thin-film island having sidewalls which are crossed by the insulated gate, edge regions of the thin-film island adjacent the sidewalls being of amorphous semiconductor material, which method is characterised by the steps of:

(a) depositing on a substrate a thin film of amorphous semiconductor material to provide the semiconductor material for the thin-film island, (b) removing areas of the thin film from the substrate to form the sidewalls of the thin-film island, (c) forming a masking pattern over the edge regions of the thin-film island and over adjacent areas of the substrate for masking against an energy beam, and (d) directing the energy beam towards the thin-film island and the masking pattern to crystallise the un-masked semiconductor material of the thin-film island for forming the crystalline semiconductor channel region in the thin-film island, while retaining amorphous semiconductor material adjacent the sidewalls where the edge regions are masked from the energy beam by the masking pattern.

In such a method in accordance with the present invention, the thin-film semiconductor material is deposited as amorphous material. For this purpose, low temperature deposition processes may be used, and these deposition processes may be readily compatible with, for example, substrates comprising polymer material. This amorphous material is then retained in the edge regions to reduce the edge leakage currents in the TFT. This retention of amorphous regions is achieved by appropriate masking during the step (d) of crystallising the channel region with the energy beam. It is often necessary to provide a masking pattern during an energy beam treatment, for example, to mask other thin-film islands (where amorphous silicon TFTs or other amorphous devices are desired) and/or to mask areas of the substrate (particularly when the substrate comprises polymer material). Thus, the appropriate masking of the edge regions of a thin-film island may be achieved simply by changing the layout of a masking pattern already used in the energy beam treatment.

It is advantageous to provide the masking pattern on an insulating film at least at the edge regions of the thin-film island. The insulating film may be of electrically and/or thermally insulative material, and at least part of this insulating film may be retained in the manufactured device. The insulating film may serve to protect the semiconductor thin-film material and/or the substrate material during various processing steps, for example, when depositing and removing material for the masking pattern, when removing photo-resist, and when crystallising the channel region with the energy beam.

For these purposes, an insulating film may be provided over at least an upper face of the thin-film island, and the masking pattern may be provided on this insulating film at the edge regions of the thin-film island. Alternatively, and/or additionally, an insulating film may be provided between the steps (b) and (c) over at least the side walls and edge regions of the thin-film island, and the masking pattern may be formed subsequently on this insulating film over the side walls and edge regions. Even in cases where the masking pattern itself may reach a very high temperature during the energy beam treatment, the underlying edge regions can be kept at a low temperature (well below a crystallisation temperature) by the intermediate insulating film.

The insulating film may be present over an upper face of the thin-film island between the edge regions during the crystallisation step (d) and so may protect the upper face of the thin-film island during a subsequent step in which at least a part of the masking pattern is removed. However, a smoother upper face for the crystallised channel region is often formed if the upper face is not covered with an insulating film during the crystallisation step (d). Thus, the insulating film may be present over an upper face of the thin-film island between the edge regions while forming the masking pattern in the step (c), after which an area of the insulating film not covered by the masking pattern may be removed to expose an area of the upper face via which the semiconductor channel region is crystallised between the edge regions by the energy beam in the step (d).

The present invention may be used to reduce the leakage currents of TFTs which have a top gate (i.e an insulated gate at the upper face of the thin-film island) and/or a bottom gate (i.e an insulated gate between the thin-film island and the substrate). The invention is particularly advantageous for TFTs having a top gate which extends also on the sidewalls of the island. When the TFT has an insulated gate provided at the upper face of the thin-film island, at least a part of the insulating layer (which was under the masking pattern) may be retained on at least the edge regions of the thin-film island under the insulated top gate. This retained part of the insulating layer may provide a thicker dielectric between the insulated gate and the edge regions of the thin-film island, so reducing the capacitive coupling between the gate and the island in these regions and so further reducing the edge leakage current.

The invention may be used to manufacture electronic devices in which the substrate is of glass or of another insulating material. The invention is particularly advantageous when the substrate comprises an insulating polymer material which may otherwise be damaged by the energy beam. Thus, the layout of the masking pattern may easily be chosen so that (1) it covers edge regions of the thin-film island around the whole perimeter of the thin-film island and (2) it extends from the thin-film island over areas of the substrate not covered by the thin-film semiconductor material so as to mask these areas of the substrate from the energy beam in the step (d).

Figure 5:
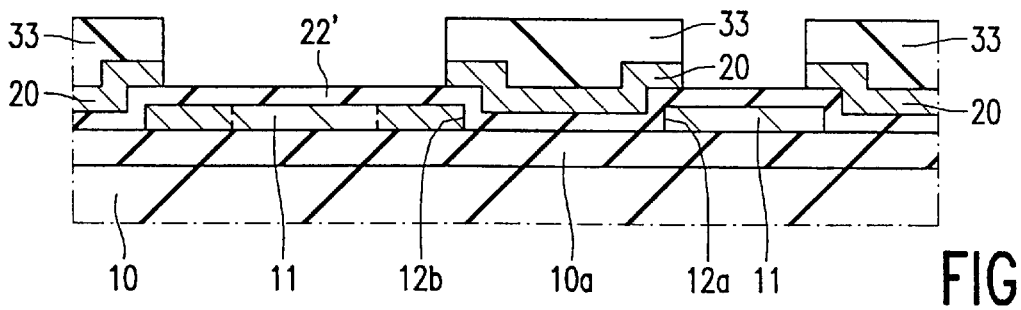
Figure 6:
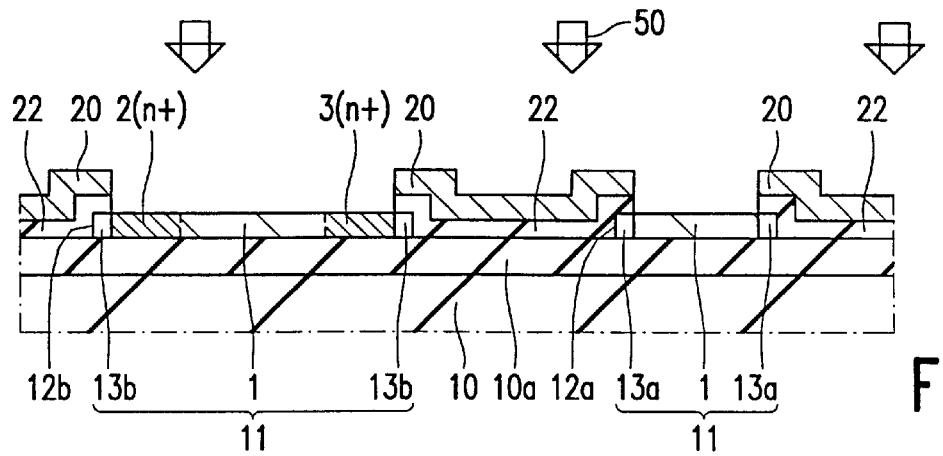
Figure 7:
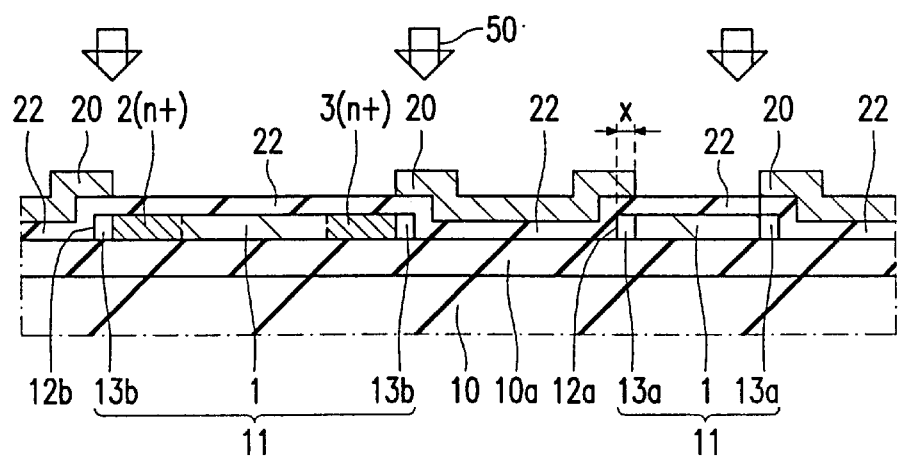

These and other features in accordance with the present invention, and their advantages, are illustrated specifically in embodiments of the invention now to be described, by way of example, with reference to the accompanying diagrammatic drawings, in which:

FIGS. 1 to 9 are cross-sectional views of part of an electronic device structure at successive stages in its manufacture by a method in accordance with the present invention. FIG. 7 shows an alternative variation for the process step of FIG. 6.

It should be understood that all the Figures are diagrammatic and not drawn to scale. Relative dimensions and proportions of parts of the cross-sectional views have been shown exaggerated or reduced in size for the sake of clarity and convenience in the drawings. The same reference signs are generally used to refer to corresponding or similar features in different embodiments.

Figure 8:
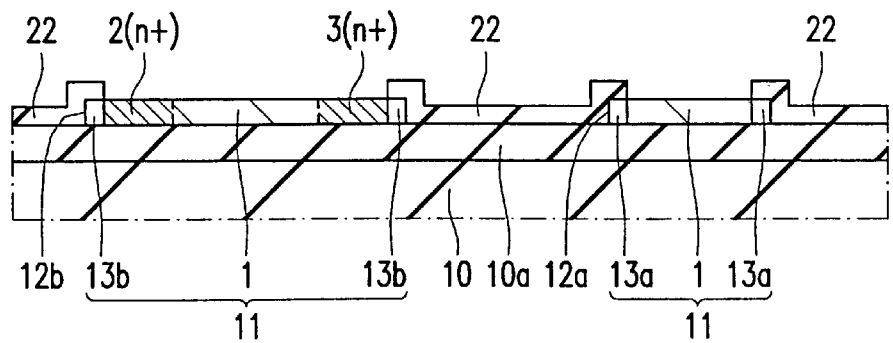
Figure 9:
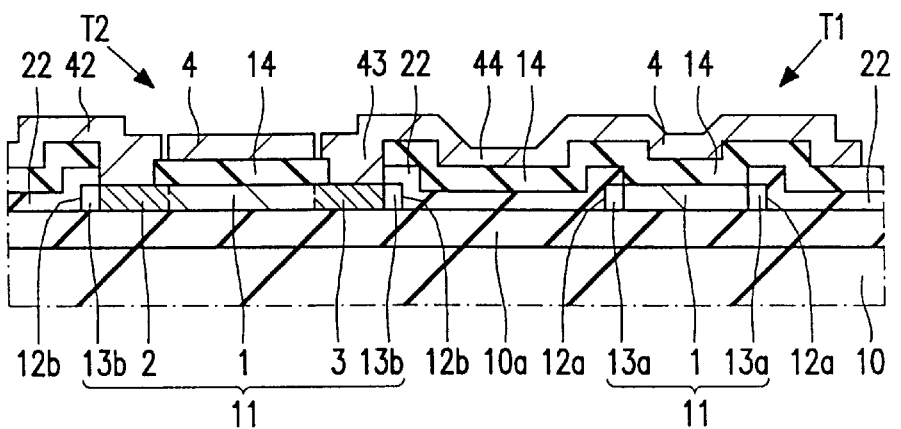

FIGS. 1 to 9 illustrate stages in the manufacture of a large-area electronic device comprising thin-film circuitry including TFTs. A part of the final device with two TFTs T1 and T2 is illustrated in FIG. 9. Each of the TFTs T1 and T2 has a crystalline semiconductor channel region 1 in a silicon thin-film island 11 adjacent an insulated gate 4 of the TFT. The thin-film island 11 has side walls 12a and 12b around its perimeter, and this perimeter typically may be of rectangular outline in plan view. It should be noted that the TFTs T1 and T2 are shown extending at right angles to each other. Thus, the FIG. 9 cross-section through the TFT T2 is taken along the length of the channel region 1 between source and drain regions 2 and 3 of the TFT, whereas the FIG. 9 cross-section of the TFT T1 is taken across the width of the channel region 1 below the insulated gate 4. The side walls 12a are crossed by the insulated gate 4, as can be seen in FIG. 9 for the TFT T1. The side walls 12b are at the source and drain ends of the island 11. Edge regions 13a and 13b of the island 11 are present adjacent the side walls 12a and 12b respectively and are of amorphous semiconductor material. The method of manufacturing this device in accordance with the present invention comprises the steps of:

(a) depositing on a substrate 10 (FIG. 1) a thin film 11' of amorphous semiconductor material to provide the semiconductor material for the thin-film islands 11, (b) removing areas of the thin film 11' from the substrate 10 to form the side walls 12a and 12b of each island 11 (FIG. 2), (c) forming a masking pattern 20 over the edge regions 13a and 13b of the islands 11 and over adjacent areas 10a of the substrate 10 (FIG. 5) for masking against an energy beam 50, and (d) directing the energy beam 50 towards the islands 11 and the masking pattern 20 (FIG. 6 or FIG. 7) to crystallise the un-masked semiconductor material of the islands 11 for forming the crystalline semiconductor channel region 1 in the islands 11, while retaining amorphous semiconductor material adjacent the side walls 12a and 12b where the edge regions 13a and 13b are masked from the energy beam 50 by the masking pattern 20.

The resulting device structure of FIG. 9 has polycrystalline TFTs T1 and T2 with low off-state leakage currents as a result of the amorphous material properties kept for the edge regions 13a particularly where crossed by the insulated gate 4. Thus, the present invention provides at least one further measure for the reduction of TFT leakage currents. It is however advantageous to use this further measure in combination with other known measures for reducing the leakage current. It is advantageous to hydrogenate the FIG. 9 device structure in known manner to passivate trapping levels in the TFT channel region 1, and so it is also advantageous to carry out an implantation of dopant ions of opposite conductivity type in the area of the semiconductor film 11' at the back of the channel region 1 in accordance with the teaching in U.S. Pat. No. 5,508,555 (our reference PHB 33571). Such an implantation may be carried out into the back of the film 11' in FIG. 1 (either before or after depositing the film 21'), or it may be carried out into the back of the island 11 in FIG. 8 after the crystallisation step (d) of FIG. 6 or 7.

The device structure of FIG. 9 may be part of a flat panel display similar to that illustrated in U.S. Pat. No. 5,130,829, or a large-area image sensor or data store. The TFTs T1 and T2 may be two matrix switching TFTs of the device or they may be TFTs in drive circuits integrated on the same device substrate as the matrix. Low levels of Off-state leakage currents are particularly important in switching transistors both for the matrix and for the drive circuits. The particular TFT technology and transistor parameters are chosen as appropriate for the desired circuit characteristics and device specification. Where the circuit additionally requires different TFT characteristics, some thin-film islands formed from the amorphous silicon thin film 11' may be wholly covered by the masked pattern 20 so that TFTs with amorphous silicon channel regions are formed in these particular islands.

The device substrate 10 is electrically insulating at least adjacent to its upper surface. It may be of glass or any other low-cost insulating material. The present invention is particularly advantageous for substrates comprising an insulating polymer material which may be damaged (for example, degraded or even ablated) by the energy beam 50 in the absence of the masking pattern 20. Polymer materials which may be desired for the substrate 10 in particular devices, together with their maximum usable temperatures are:

| Polyimide | | 275° C. |
|---|---|---|
| Polyethersulphone | (PES) | 200° C. |
| Polyacrylate | (PAR) | 180° C. |
| Polyetherimide | (PEI) | 170° C. |
| Polyethyelenenapthalate | (PEN) | 150° C. |
| Polyethyeleneterepthalate | (PET) | 130° C. |

The maximum usable temperature for a polymer material refers to the maximum sustained temperature at which the polymer material can be held for a prolonged period and retain its polymer characteristics, for example its flexibility and electrically insulating properties. Thus, for example, this temperature should not be exceeded when depositing the various thin-film materials in the manufacture of the device. Before depositing the thin-film circuitry on the polymer substrate 10, the substrate 10 is pre-shrunk by a prolonged heating at a temperature below but close to the maximum usable temperature. It is then advantageous to deposit a comparatively thick insulating film 10a on the polymer surface before depositing the silicon film 11', so that the insulating film 10a can act as a thermal buffer layer during subsequent thermal processing steps. The insulating film 10a may be of, for example, silicon oxide and/or nitride deposited at a temperature in the range of, for example, 100° C. to 200° C. and to a thickness of, for example, about 0.4 $\mu$m. Thus, in a silicon-based technology, the film 10a may be of, for example, silicon oxide or silicon nitride or silicon oxynitride or a combination of films of these materials.

The silicon film 11' for the thin-film circuit elements may then be deposited in known manner on the polymer substrate 10 with its insulating film 10a. The film 11' is deposited as amorphous silicon material. A plasma-enhanced chemical vapour deposition (PECVD) process may be used at a low temperature, for example between 100° C. and 250° C. Typically, the resultant silicon film 1 has a hydrogen content, i.e it is generally known as $\alpha$-Si:H. The thickness of the silicon film 11' determines the thickness of the TFT channel regions 1 and is typically less than 0.1 $\mu$m, for example about 0.05 $\mu$m or less.

An insulating film 21' may then deposited over the amorphous silicon film 11' as illustrated in FIG. 1. The insulating film 21' may be of, for example, silicon oxide and/or nitride provided by a PECVD process. The insulating film 21' forms a protective layer over the amorphous silicon material during the processing steps of FIGS. 2 and 3.

Figure 2:
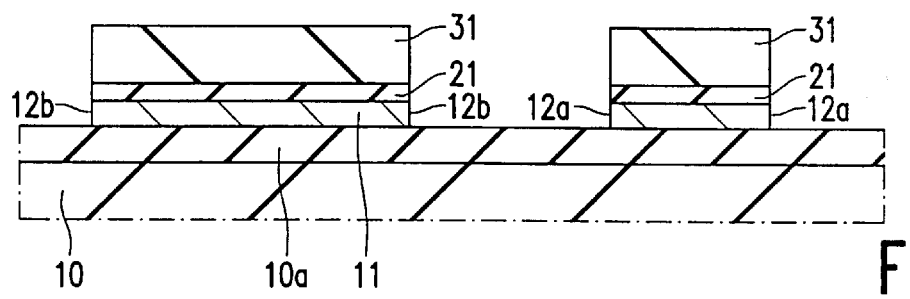

As illustrated in FIG. 2, areas of the amorphous silicon thin-film 11' are now removed from the substrate 10 using a known etching technique so as to form the thin-film islands 11 for the individual thin-film circuit elements such as TFTs T1 and T2. This etch definition of the islands 11 may be carried out using plasma etching or an ion etching process. A wet etching process, for example using a catechol solution, may alternatively be used. Particularly when catechol is used to etch the silicon material 11', the etchant may also remove the photoresist mask 31. Thus the areas 21 of the insulating film 21' remaining on the silicon islands 11 may protect the silicon islands 11 during this etching treatment. The areas to be removed are defined photolithographically using a photoresist mask 31 provided on the insulating film 21'. After forming the islands 11, any remainder of the photoresist mask 31 may be removed in known manner with known strippers, for example containing KOH. The film 21 protects the upper face of the islands 11 during this stripping of the mask 11.

Figure 3:
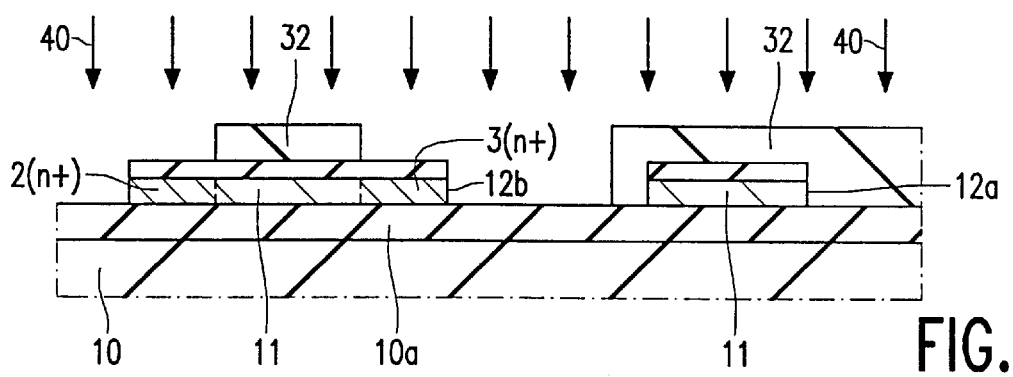
Figure 4:
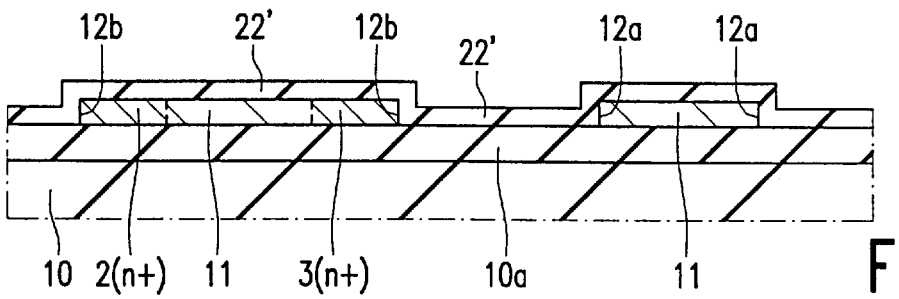

Source and drain regions 2 and 3 may now be formed in the thin-film silicon islands 11, for example by implantation of dopant ions 40. Such an implantation step is illustrated in FIG. 3. The implantation may be localised in known manner using a masking pattern 32 of, for example, photoresist. Ions 40 of arsenic or phosphorous may be implanted in the islands 11 in known manner to provide source and drain regions 2 and 3 of n type conductivity. The implanted regions 2 and 3 in FIG. 3 are labelled as n+. However, a subsequent annealing step is required to activate the implanted dopant to provide the n type conductivity, as known in the art. This subsequent annealing can occur during the laser beam crystallisation step (d) of FIG. 6 or FIG. 7. The implantation masking pattern 32 is subsequently removed in known manner, for example with known strippers containing KOH. During this removal step, the insulating film areas 21 protect the silicon thin-film islands 11. The insulating film areas 21 may then be removed and a fresh insulating film 22' may be deposited as illustrated in FIG. 4. This film 22' may be of, for example, silicon oxide and/or nitride deposited by a known PECVD process to a thickness of, for example, about 0.15 $\mu$m.

The masking pattern 20 is now provided on the insulating film 22'. This masking pattern 20 may be of a metal (for example, aluminium or chromium) which at least partly reflects the energy beam incident thereon. However, the masking pattern 20 may be of a semiconductor material which largely absorbs the energy beam. Thus, for example, silicon (the same semiconductor material as the thin-film island 11) may be used for the masking pattern 20. Known photolithographic and etching techniques may be used to form the masking pattern 20 from a film of the masking material deposited on the insulating film 22'. FIG. 5 illustrates the etch definition of the pattern 20 using a photoresist mask 33. When the masking pattern 20 is of a material which is selectively etchable with respect to the thin-film silicon island 11, then the areas of the insulating film 22' not covered by the masking pattern 20 may be removed to expose an area of the upper face of the island 11 at windows in the masking pattern 20. However, when the masking pattern 20 is not selectively etchable with respect to the thin-film island 11, the insulating film 22' is kept over the upper face of the island 11 at the windows in the masking pattern 20 so as to protect the upper face of the island 11 during a later etching step in which the masking pattern 20 is removed.

FIGS. 6 and 7 show alternative variations for the laser crystallisation process step (d) in accordance with the present invention. The energy beam 50 is typically a pulsed laser beam of an ultra-violet wavelength generated by an excimer laser. A laser beam 50 of ultra-violet wavelength has the known advantage of permitting control of its absorption depth in the semiconductor material of the island 11 and/or of the masking pattern 20. Useful laser wavelengths are 248 nm from a KrF laser or a wavelength of 308 nm from a XeCl laser or a wavelength of 351 nm from a XeF laser. The thickness of the silicon islands 11 is chosen to be larger than the absorption depth of the laser beam 50 in this material, but slightly less than a thermal diffusion length. The silicon material of the island 11 is locally melted by absorption of the laser beam 50 and so is at a temperature in excess of 1000° C. The underlying insulating film 10a has a thickness sufficient to act as a thermal barrier between this very hot island 11 and the polymer substrate 10.

When the masking pattern 20 is of silicon, its thickness is preferably larger than a thermal diffusion length so as to provide an effective mask for the edge regions 13 of the island against the laser beam 50. This somewhat larger thickness of the silicon masking pattern 20 as well as the thickness of the underlying insulating film areas 22 can provide an adequate thermal barrier over the edge regions 13. At a wavelength of 240 nm, a chromium masking pattern 20 is about 50% reflective and 50% absorptive of the laser energy. Thus, a chromium masking pattern 20 will also reach a high temperature, so requiring an adequate thermal barrier to be provided by the underlying insulating film 22. An aluminium masking pattern 20 is largely reflective of this laser wavelength and so its temperature is much cooler.

FIG. 6 illustrates the laser crystallisation step in which the semiconductor channel region 1 is crystallised between the masked edge regions 13 by the laser beam 50 which is incident via the exposed upper face of the island 11. Such an arrangement with an exposed upper face may be used when the masking pattern 20 is of chromium or aluminium. FIG. 7 illustrates a variation in which the channel region 1 is crystallised by the laser beam 50 incident via an overlying area of the insulating film 22'. Such an arrangement may be used when the masking pattern 20 is of silicon, or of chromium or aluminium.

In a specific example of the laser crystallisation treatment of FIGS. 6 and 7, a 248 nm wavelength from a pulsed KrF laser may be used, with an incident laser energy on the island 11 in the range of 100 to 300 mJ.cm$^{-1}$ per pulse. The pulse duration may be of the order of nanoseconds. A single pulse exposure could be used for crystallisation of the channel region 1, or exposure to multiple pulses (for example, 5 or 10 such pulses) may be used. By this laser treatment of FIGS. 6 and 7, the amorphous silicon material of the channel region 1 is converted to polycrystalline silicon material, whereas that of the edge regions 13 remains as amorphous silicon material due to the masking pattern 20. The polycrystalline material may typically have a grain size of 0.1 to 0.3 µm. The electron field effect mobility through this polycrystalline material in n-channel TFTs may be typically, for example, in the range of 50 to 200 cm$^2$.V$^{-1}$.s$^{-1}$.

The masking pattern 20 is then etched away. If desired, the insulating film 22, 22' may also be etched away to leave merely the silicon thin-film islands on areas of the insulating film 10a on the polymer substrate 10. However, it can be advantageous to retain at least the part of the insulating film 22' on the edge-regions 13a at least where they are traversed by the insulated gate 4. FIG. 8 illustrates a structure in which the insulating film 22 is kept on all the edge regions 13, both at the upper face and at the side walls 12a and 12b of the islands 11. The gate dielectric film 14 is now deposited in known manner. Contact windows are opened in the film 14, for example for connections to the source and drain regions 2 and 3. An interconnection metallisation pattern of, for example, aluminium is then provided to form source and drain electrodes 42 and 43, gate electrodes 4 and interconnections 44. The resulting structure is illustrated in FIG. 9.

As can be seen from FIG. 9, the retained parts 22 of the insulating film 22' on the edge regions 13a and their side walls 12a form a thicker dielectric between the insulated gate 4 and the edge regions 13a of the thin film island 11. This thicker dielectric reduces the capacitive coupling between the gate 4 and the island 11 in these regions 13a and so further reduces the edge leakage current. Thus, in addition to using prior art techniques (such as hydrogenation and a back implant) to reduce the leakage current, this device structure manufactured in accordance with the present invention has two further measures for reducing the leakage current, namely the amorphous material properties kept in the edge regions 13a and the thicker dielectric 22 between these amorphous edge regions 13a and the insulated gate 4.

There appears to be a variety of effects which both individually and in combination result in a significant edge leakage current along the side wall 12a of the channel region 1. These effects arise both from the nature of the thin-film materials and processes used in TFT manufacture and from the TFT structure. Both mobile ion effects and charge carrier trapping effects appear to be involved. In TFTs without the amorphous edge regions 13a poor bonding of the gate dielectric 14 at the sidewalls 12a, stress effects, and poor step coverage may be responsible for these undesirable edge leakage effects. As a result there may occur charging of the dielectric 14 at the sidewall 12a, water-related effects, and poor step coverage effects. As regards charging of the dielectric 14 at the sidewalls 12a, the charges can be positive or negative and can induce conducting electron or hole skins in TFTs without the amorphous edge regions 13a. As regards water-related effects, the water may enter the dielectric 14 through pores therein, for example during wet processing steps and washing. This water can similarly produce positive and negative charging instabilities in the dielectric 14. These instabilities can be particularly bad on sidewalls 12a, probably because of stress-induced compositional changes. Poor step coverage can lead to so-called "mouse-holes", local voids penetrating below the gate 4, as a result of local etch penetration. These mouse-holes can lead again to charging instability, probably due to surface charging of the dielectric 14. As a result of those effects, hysteresis is often seen in the TFT characteristics, and additional high leakage current and sub-threshold kinks occur.

These effects disappear or are at least significantly reduced for TFTs with amorphous edge regions 13a formed in accordance with the present invention. By using amorphous silicon material of very poor conductive quality for the edge regions 13a, the effects resulting from the dielectric charging can be effectively suppressed, because charging of the dielectric 14 and/or 22 on these edge regions 13a will induce trapped charges at defects in the amorphous material rather than inducing a conductive electron or hole skin. Thus, no conductive channel will turn on in the edge regions 13a, and the only conductive channel will be formed in the crystalline channel region 1.

Preferably the edge regions 13a should be of amorphous material over a distance (width) of at least 0.5 µm from the sidewalls 12a. For this reason the mask 20 should preferably extend a distance X of at least 1 µm over the upper face of the island 11 from the sidewall 12a. A minimum overlap distance X is desirable so as to reduce extra capacitance between the gate 4 and the channel 1 via the gate-overlapped edge regions 13a. However, the minimum distance X is generally determined by the photo-lithographic alignment tolerances. In a present-day manufacturing process with acceptably wide tolerances, the mask 20 may overlap the island 11 by a distance X of typically about 3 µm. The extra capacitance resulting from the extra width of the amorphous regions 13a can be reduced by increasing the electrical resistance of the amorphous material so providing a long time-constant for capacitive charging. Retention of part of the insulating film 22 also reduces the capacitance as described above.

Other dimensions of the islands 11 depend on the desired TFT characteristics, for example for small-signal switching within a matrix and for performing various functions in a drive circuit. Typically the length of the channel region 1 between source and drain regions 2 and 3 may be about 3 µm or more, for example 5 µm, 10 µm or 15 µm. The width of the channel region 1 between the edge regions 13a may be typically about 4 µm or more for a small signal TFT, or it may be much more, for example up to about 50 µm in the case of a high current carrying TFT in a drive circuit. Thus, the relative proportions of the width of the island 11 occupied by the crystalline channel region 1 and the amorphous edge regions 13a will vary greatly depending on the type of TFT.

It will be evident that many modifications and variations are possible within the scope of the present invention. Although the source and drain regions 2 and 3 of TFTs T1 and T2 are formed by implantation within the islands 11, these source and drain regions 2 and 3 are not self-aligned with the gate 4. Thus, for example, in the process illustrated in FIGS. 1 to 9, the source and drain regions are provided at an early stage (FIG. 3) in the manufacturing sequence, using an implantation mask 32 which is different from the gate 4. The gate 4 is provided later (FIG. 9). In a modified process, the source and drain regions 2 and 3 may be implanted using a gate electrode 4 as an implantation mask after the laser crystallisation step of FIG. 6 or FIG. 7 and before providing a separate source, drain and interconnection metallisation 42, 43, 44. In this case a so-called "self-aligned" TFT may be formed. In order to anneal and so to activate the implanted dopant a second laser beam exposure may be carried out. During this second laser beam exposure the amorphous edge regions 13b and the areas of the amorphous edge regions 13a not masked by the gate electrode 4 may be exposed. Thus, in this situation at least partial crystallisation may occur of the amorphous edge regions 13a and 13b, except where the regions 13a are masked from the laser beam by the overlying insulated gate electrode 4. Thus, in this case, the self-aligned TFT formed as a modification of T1 and T2 in FIG. 9 may retain amorphous edge regions 13 only in the part of the edge regions 13a which is adjacent the channel region 1 and which is crossed by the insulated gate 4. The other parts of the edge regions 13a and the whole of the edge regions 13b may thus be crystalline.

It will be evident that other types of TFT may also be fabricated in the islands 11 of polycrystalline material having amorphous edge regions 13. Thus, for example, the source and drain regions 2 and 3 may be formed by doped films deposited on the undoped silicon islands 11. In this case, TFTs of the so-called "co-planar" type may be formed. TFTs of the so-called "staggered" type may also be fabricated in which the source and drain regions 2 and 3 are formed by doped semiconductor films deposited on the substrate film 10a before the silicon film 11'. The present invention may also be used in the fabrication of TFTs of the so-called "inverted staggered" type, in which an insulated gate structure 4,14 is formed on the substrate film 10a before deposition of the semiconductor film 11', and the source and drain regions 2 and 3 are formed by doped semiconductor films on the islands 11. An advantage of the TFT in having its insulated gate structure 4,14 between the substrate 10 and the semiconductor island 11 is that the gate electrode 4 does not extend on the sidewalls 12a of the island 11, and so the capacitive coupling between the gate electrode 4 and the edge regions 13a is very small.

Although both the islands 11 shown in FIG. 9 have channel regions 1 of polycrystalline silicon material grown in the crystallisation stage of FIG. 6 or FIG. 7, it will be evident that the laser exposure of FIG. 6 or FIG. 7 may be localised to selected islands 11. In this case amorphous silicon material may be retained in the non-selected areas, so that TFTs with amorphous silicon channel regions may be formed in these non-selected areas, for example from islands 11 which are totally masked by the masking pattern 20. It will also be evident that additional thin-film circuit elements other than TFTs may be fabricated in the device. Thus, for example, silicon thin-film diodes may be formed, for example in amorphous silicon islands.

In the form illustrated by way of example in FIGS. 1 to 5, a first insulating film 21 protects the islands 11 during their etch definition and the removal of the resist 31, and this first insulating film 21 is then removed. A second insulating film 22 is then deposited, and the laser mask pattern 20 is formed on this second insulating film 22. An advantage of this arrangement is that the sidewalls 12 of the island 11 are covered by the insulating film 22. However, a modification is possible in which the mask pattern 20 is formed on the first insulating film 21 and on the sidewalls 12 of the islands 11. When the masking pattern 20 is of Al or Cr it can be removed subsequently by selective etching with respect to the silicon sidewalls 11. When the masking pattern 20 is of Si, then a wider overlap distance X can be chosen so as to allow for any lateral etching of the amorphous edge regions 13 at the sidewalls 12 during the removal of the masking pattern 20.

In the form illustrated by way of example in FIGS. 3 and 9, a single dopant ion implantation step is carried out to form the source and drain regions 2 and 3 as single doped regions adjacent the channel region 1. However, especially in drive circuitry, it can be advantageous to provide a low-doped drain region between the regions 1 and 3 for field-relief purposes to reduce hot electron effects. This structure can be achieved by carrying out two separate implantations, namely a high dose implantation with a mask 32 as in FIG. 3 and a low dose implantation with a narrower mask 32. When these two implantations are effected before the laser crystallisation treatment of FIG. 6 or FIG. 7, they may be annealed and activated in this laser crystallisation treatment.

When the substrate 10 is of degradable polymer material, the substrate areas not covered by the silicon islands 11 are masked against the laser beam 50 in FIG. 6 or 7 by the masking pattern 20 which extends thereover from around the whole perimeter 12a and 12b of the island 11. Such an extensive masking pattern 20 is not necessary where the substrate 10 is of a non-degradable glass, for example. In this case, the masking pattern 20 may extend merely over the edge regions 13a (and the immediately-adjacent substrate area at the sidewalls 12a) which are crossed by the insulated gate 4 in the final TFT structure.

In the embodiments so far described with reference to the Figures, a laser was used to generate the energy beam 50. A laser beam 50 is particularly convenient for controlling the crystallisation and heating conditions. However, other forms of energy beam (for example an electron beam or high-power lamp radiation) may be used for crystal growth in the step of FIG. 6 or FIG. 7. Thus, the energy beam treatment of FIG. 6 or FIG. 7 may be effected by a short-duration exposure to very high intensity lamps of ultraviolet wavelength, while the insulating films 22 and 10*a* and masking pattern 20 protect the polymer substrate 10. Whereas a pulse duration of nanoseconds is typical for a laser beam 50, a much longer exposure time (for example of about a millisecond) is typical of switched high intensity lamps. The longer exposure time increases the thermal diffusion length in the silicon, and hence increases the extent of lateral crystallisation growth below the edge of the masking pattern 20. In the case of nanosecond pulses the extent of lateral crystallisation growth is barely noticeable, for example less than 0.5 $\mu$m. The extent of lateral crystallisation becomes noticeable with longer exposure times, but allowance can be made for this effect in choosing the overlap distance X of the masking pattern 20.

From reading the present disclosure, other modifications and variations will be apparent to persons skilled in the art. Such modifications and variations may involve equivalent features and other features which are already known in the design, manufacture and use of electronic devices comprising TFTs and other thin-film circuit elements, and component parts thereof, and which may be used instead of or in addition to features already disclosed herein. Although Claims have been formulated in this Application to particular combinations of features, it should be understood that the scope of the disclosure of the present application includes any and every novel feature or any novel combination of features disclosed herein either explicitly or implicitly and any generalisation thereof, whether or not it relates to the same invention as presently claimed in any Claim and whether or not it mitigates any or all of the same technical problems as does the present invention. The Applicants hereby give notice that new Claims may be formulated to such features and/or combinations of such features during prosecution of the present application or of any further application derived therefrom.

I claim:

1. A method of manufacturing an electronic device comprising a thin-film transistor having a crystalline semiconductor channel region in a semiconductor thin-film island adjacent an insulated gate of the transistor, the thin-film island having sidewalls which are crossed by the insulated gate, edge regions of the thin-film island adjacent the sidewalls being of amorphous semiconductor material, characterised by the steps of:

(a) depositing on a substrate a thin film of amorphous semiconductor material to provide the semiconductor material for the thin-film island, (b) removing areas of the thin film from the substrate to form the sidewalls of the thin-film island, (c) forming a masking pattern over the edge regions of the thin-film island and over adjacent areas of the substrate for masking against an energy beam, and (d) directing the energy beam towards the thin-film island and the masking pattern to crystallise the un-masked semiconductor material of the thin-film island for forming the crystalline semiconductor channel region in the thin-film island, while retaining amorphous semiconductor material adjacent the sidewalls where the edge regions are masked from the energy beam by the masking pattern.

2. A method as claimed in claim 1, further characterised by providing between the steps (b) and (c) an insulating film over at least the sidewalls and edge regions of the thin-film island, and subsequently forming the masking pattern in the step (c) on the insulating film over the sidewalls and edge regions.

3. A method as claimed in claim 1, further characterised in that an insulating film is provided over at least an upper face of the thin-film island, and the masking pattern is provided on the insulating film at the edge regions of the thin-film island.

4. A method as claimed in claim 2, further characterised in that the insulating film is present over an upper face of the thin-film island between the edge regions while forming the masking pattern in the step (c), after which an area of the insulating film not covered by the masking pattern is removed to expose an area of the upper face via which the semiconductor channel region is crystallised between the edge regions by the energy beam in the step (d).

5. A method as claimed in claim 2, further characterised in that the insulating film is present over an upper face of the thin-film island between the edge regions during the crystallisation step (d) and protects the upper face of the thin-film island during a subsequent step in which at least a part of the masking pattern is removed.

6. A method as claimed in claim 5, further characterised in that the masking pattern is of the same semiconductor material as the thin-film island.

7. A method as claimed in claim 4, further characterised in that the masking pattern is of a metal which at least partly reflects the energy beam incident thereon.

8. A method as claimed in claim 2, further characterised in that at least a part of the insulating layer is retained on at least the edge regions of the thin-film island under the insulated gate of the transistor, the insulated gate being provided at the upper face of the thin-film island.

9. A method as claimed in claim 1, further characterised in that the substrate comprises an insulating polymer material, and the masking pattern covers edge regions of the thin-film island around the whole perimeter of the thin-film island and extends from the thin-film island over areas of the substrate not covered by the thin-film semiconductor material so as to mask these areas of the substrate from the energy beam in the step (d).

10. A method as claimed in claim 1, further characterised in that the masking pattern extends a distance of at least 1 $\mu$m (micrometre) over the edge regions from the sidewalls of the thin-film island.

* * * * *